US005631471A

United States Patent [19]

Anderl et al.

[11] Patent Number: 5,631,471

[45] Date of Patent: May 20, 1997

[54] DEVICE TO IRRADIATE SURFACES WITH ELECTRONS

[75] Inventors: Peter Anderl; Klaus Bloemer, both of Munich; Alfred Mueller; Ulrich Schwab, both of Groebenzell; Eberhard Hartmann, Priester; Reiner Mehnert, Markkleeberg; Alexander Mende, Leipzig, all of Germany

[73] Assignee: IGM-Robotersysteme Aktiengesellschaft, Germany

[21] Appl. No.: 528,957

[22] Filed: Sep. 15, 1995

[30] Foreign Application Priority Data

Sep. 16, 1994 [DE] Germany .......................... 44 32 984.9

[51] Int. Cl.[6] ............................ H01J 33/02; H01J 37/065

[52] U.S. Cl. ......................................... 250/492.3; 313/453

[58] Field of Search ............................ 250/492.3, 493.1; 313/448.1, 449.1, 304, 453

[56] References Cited

U.S. PATENT DOCUMENTS 3,144,552 8/1964 Schonberg et al. .................. 250/492.3

4,543,487 9/1985 Puumalainen et al. .............. 250/492.3

FOREIGN PATENT DOCUMENTS 871303 5/1971 Canada .............................. 250/492.3

*Primary Examiner*—Jack I. Berman

[57] ABSTRACT

The invention relates to a device to irradiate surfaces with electrons, especially to harden surface layers. The device includes a vacuum chamber that has an electron beam window; an electron beam-permeable film that closes off the vacuum chamber from the ambient medium; and an electron beam generating system, consisting of a cathode and a forming electrode which are connected to a high-voltage and beam current feed line. In order to achieve an increase of the electron beam power and to reduce the energy losses during the transfer out of the electron beam window in such a device, according to the invention, the forming electrode is designed as a tubular hollow body with inner hollow space lengthwise dividers and with a lengthwise slit that is open towards the electron beam window. A wire-shaped cathode is arranged in each hollow space segment divided off by the hollow space lengthwise divider.

7 Claims, 3 Drawing Sheets

DEVICE TO IRRADIATE SURFACES WITH ELECTRONS

BACKGROUND OF THE INVENTION

Devices generate low-energy electron beams which emerge from miniaturized vacuum chambers. They are used for electron beam hardening of rigid and flexible materials as well as in the printing sector. These sectors make different demands in terms of the electron energy and electron beam power. Relatively high electron energy levels of up to 280 keV are needed for electron beam hardening of coatings on rigid substrates, mainly on furniture parts, doors, laminated panels and strips. In these applications, sometimes layers with surface densities of 200 $g/cm^2$ have to be hardened. Since the production speeds in the furniture sector are not determined by the hardening but rather by other process-technical steps such as positioning, grinding, etc., low to medium electron beam power levels are needed, depending on the hardness dosage.

On the other hand, if a continuous surface is to betreated such as, for example, paper or film-coated substrates, and if the layer thicknesses are below 40 $g/m^2$, then it is also possible to work advantageously with lower electron energy levels. In the case of electron beam hardening of coatings on flexible materials, the work is often carried out from roll to roll. Here production speeds between 100 and 300 m/min are common. The surface densities of these coatings lie in the range from 1 to 30 $g/m^2$. This calls for low electron energy levels and medium electron beam power levels.

In the printing sector, especially in roller-offset printing, the machine speeds reach 600 to 1000 m/min. The printing speeds are somewhat lower. In spite of relatively low hardness dosages of printing inks, extremely high electron beam power levels with low electron energy levels are needed.

For this purpose, devices with electron energy levels between 150 and 250 keV and beam currents between 30 and 300 mA are used. In 'Nuclear Instruments & Methods in Physics Research', Section B 1992, Article "LEA electron accelerators for radiation processing", a new device with a wire-shaped linear cathode is described in which the electrons are formed without a control grid over a tubular electrode and transferred out through an electron beam window.

Energy losses occur when the electrons are transferred out of the device, which is under a vacuum, through a radiation-permeable window made, for example, of thin titanium film. The energy loss in a 15 μm titanium film amounts to about 25% for electrons with energy levels of 150 keV. Additional losses occur at the ribs of the support grid and due to the slanted incidence of the electrons striking the exit window. Electron beam windows are described in greater detail in DE 26 06 169 C2.

The lower limit of the electron energy is determined by the electron beam window. An upper limit of the electron beam power is obtained by the maximum possible current load/$cm^2$ of window surface area, which should not exceed 0.2 $mA/cm^2$.

In the case of such devices without control grids, it would be desirable if the energy loss during the transfer out of the electron beam window could be reduced and if equal or greater electron beam power levels could be achieved with lower electron energy levels.

SUMMARY OF THE INVENTION

The invention is based on the objective of creating a device for the irradiation of surfaces with electrons with which the electron beam power is increased and the energy losses during the transfer out of the electron beam window are decreased.

The invention relates to improvements in devices for irradiating surfaces with electrons. Such device includes a vacuum chamber that has an electron beam window, an electron beam-permeable film that closes off the vacuum chamber from the ambient medium, and an electron beam generating system consisting of a cathode and a forming electrode which are connected to a high-voltage and beam current feed line.

In accordance with the invention, with the same emission conditions of the cathodes, the beam power is doubled because there are two cathodes arranged in parallel in the hollow space sections. Moreover, by dividing the emitted electrons into two radiation fields, the expansion of the beam field is cut in half, which leads to an increase in the electrons penetrating through the electron beam window, since these electrons strike the conventional perforated or slit support grid in a much lower number.

In this context, tubular hollow bodies refer to all elongated geometric bodies such as, for example, square, polygonal and semi-circular bodies.

The hollow space lengthwise divider is an element that divides the hollow space into sections. It can have any geometrical shape. The lengthwise divider can be designed in one piece with the hollow body or else connected to the hollow body as a separate part. For example, the lengthwise divider can be formed by Joining two semi-circular hollow bodies which extend over the length.

The lengthwise slit in the hollow body together with the hollow space lengthwise divider constitute, on the one hand, electrically largely uncoupled hollow space sections of the forming electrode and, on the other hand, an open arrangement in order to avoid space-charge effects.

Due to the features of the lengthwise divider being connected with a crossbar that faces the open area of the lengthwise slit, in conjunction with the uncentered positions of the cathodes, the symmetry of the electron beam generating system is greatly reduced. Thus, in the outlet area of the lengthwise slit, this leads to a thorough mixing of the electron trajectories, which brings about a homogenization of two radiation fields. Consequently, a uniform intensity distribution of the radiation field in the area of the electron beam window prevents premature damage to the film due to excess radiation.

The features of the lengthwise divider being vertically adjustable and/or pivotable and of the cathodes being adjustable horizontally or vertically, entail degrees of freedom in the formation of the electron beam generating system, thereby allowing an initial adjustment and a readjustment. Shifting the lengthwise divider brings about a tipping of the normal of the equipotential fields of the two hollow space sections. As a result, the two radiation fields can be tipped towards or away from the vertical axis.

The effective remaining gap that results from the width of the crossbar and the width of the lengthwise slit is responsible for the electric inverse amplification factor of the potential field in the cathode space and thus for the optical refractive power of the static acceleration field in the vicinity of the lengthwise slit. Therefore, by varying the width of the crossbar and/or by changing the geometric shape, the axial width of the two radiation fields can be adjusted.

DETAILED DESCRIPTION

Figure 1:
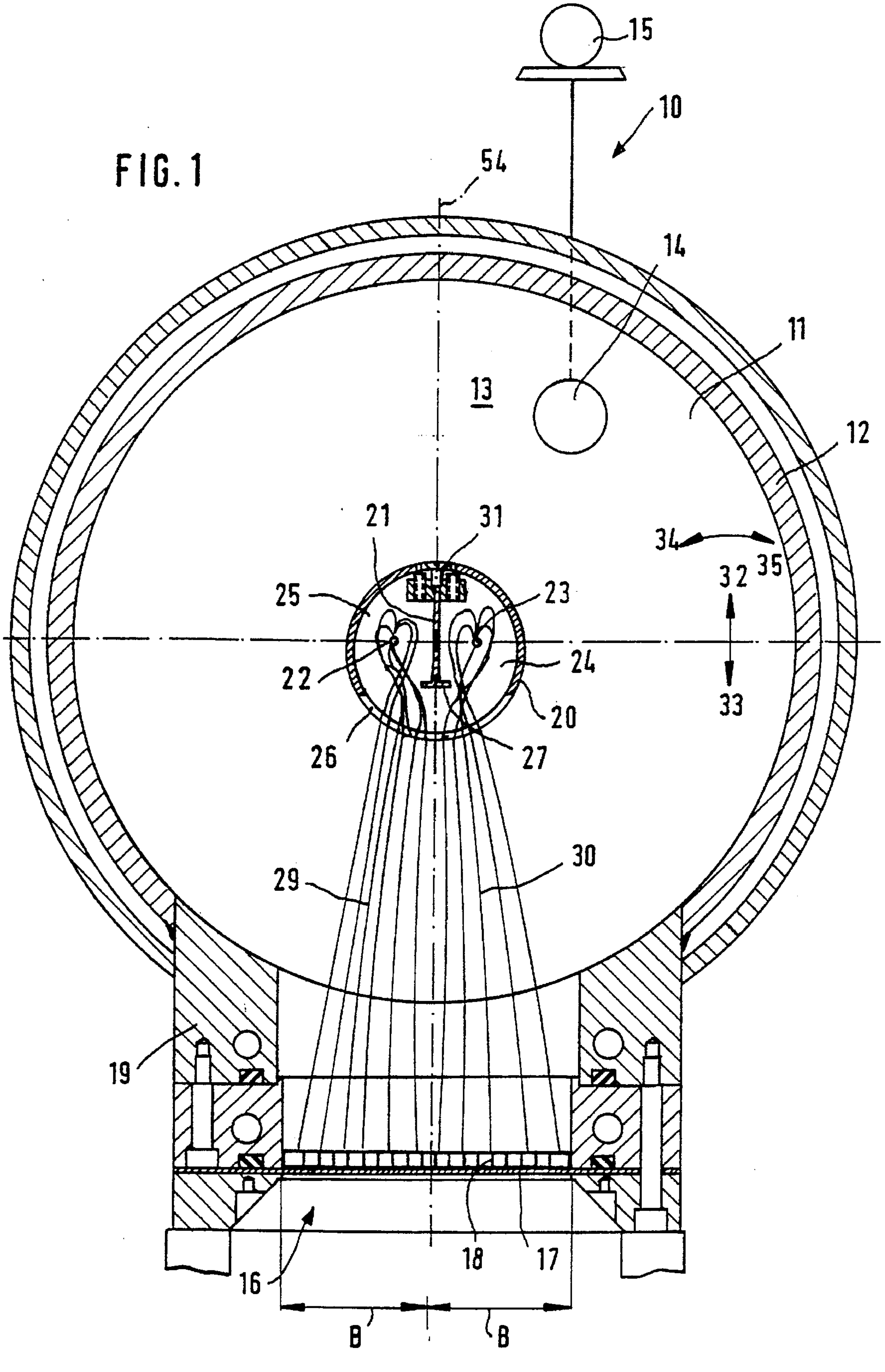
FIG. 1 is a side view in a schematic representation of the device according to the invention.
Figure 2:
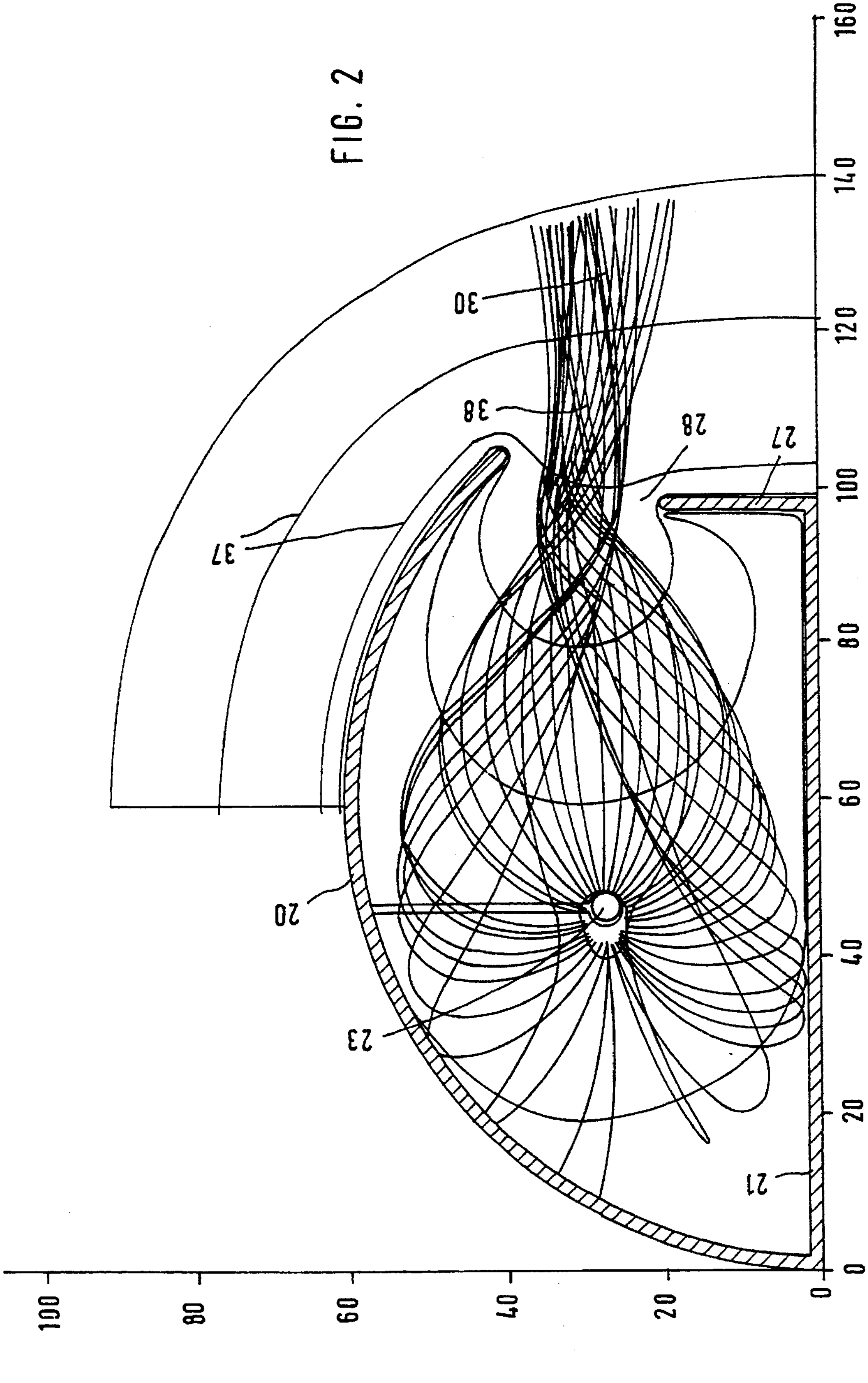
FIG. 2 shows the electron trajectories of a radiation field coming from the electron beam generating system.

FIG. 1 shows a device with the electron beam generating system according to the invention. It consists of a tubular vacuum chamber 11 with a double-walled, water-cooled housing 12. In one side 13, there is the opening 14 for connecting the vacuum pump 15. The vacuum chamber 11 also has an electron beam window 16. It consists of a metal film 17, preferably a titanium film, and of a metal support grid 18, preferably made of copper, that is attached to a rectangular flange 19. The electron beam generating system is arranged, preferably concentrically, in the vacuum chamber 11. This system is made up of a tubular hollow body 20 with inner hollow space lengthwise dividers 21 which make up the forming electrode, and one wire-shaped cathode 22, 23 in each hollow space segment 24, 25 divided off by the hollow space lengthwise divider 21. The cathodes 22, 23 consist of two tungsten wires which are heated with current flow so that they emit thermal electrons. The forming electrode, together with the cathodes 22, 23, has negative high-voltage potential and is thus attached in the vacuum chamber 11 in an insulated manner. The hollow space segment 24 and the cathode 23 are shown in an enlargement in FIG. 2 and are described in greater detail below. The hollow body 20 has a lengthwise slit 26 that is open towards the electron beam window 16. The lengthwise slit 26 in the forming electrode has an opening width in the same order of magnitude as the hollow body radius. It forms a remaining gap 28 (FIG. 2), together with a crossbar 27 that runs perpendicular to the lengthwise divider 21 and that faces the open area of the lengthwise slit 21, and this gap is responsible for the electric inverse amplification factor of the potential field in the hollow space segments 24, 25 that contain the cathodes 22, 23. Varying the width and/or geometrical shape of the crossbar 27 changes the refractive power of the static acceleration field and adjusts the axial Width B (FIG. 1) of the radiation fields 29, 30 of the electrons, which are emitted by the cathodes 22, 23.

The lengthwise slit 26 and the lengthwise divider 21 with the crossbar 27 uncouple the hollow space sections 24, 25 electrically, but they form an open arrangement in order to avoid space-charge effects.

Figure 3:
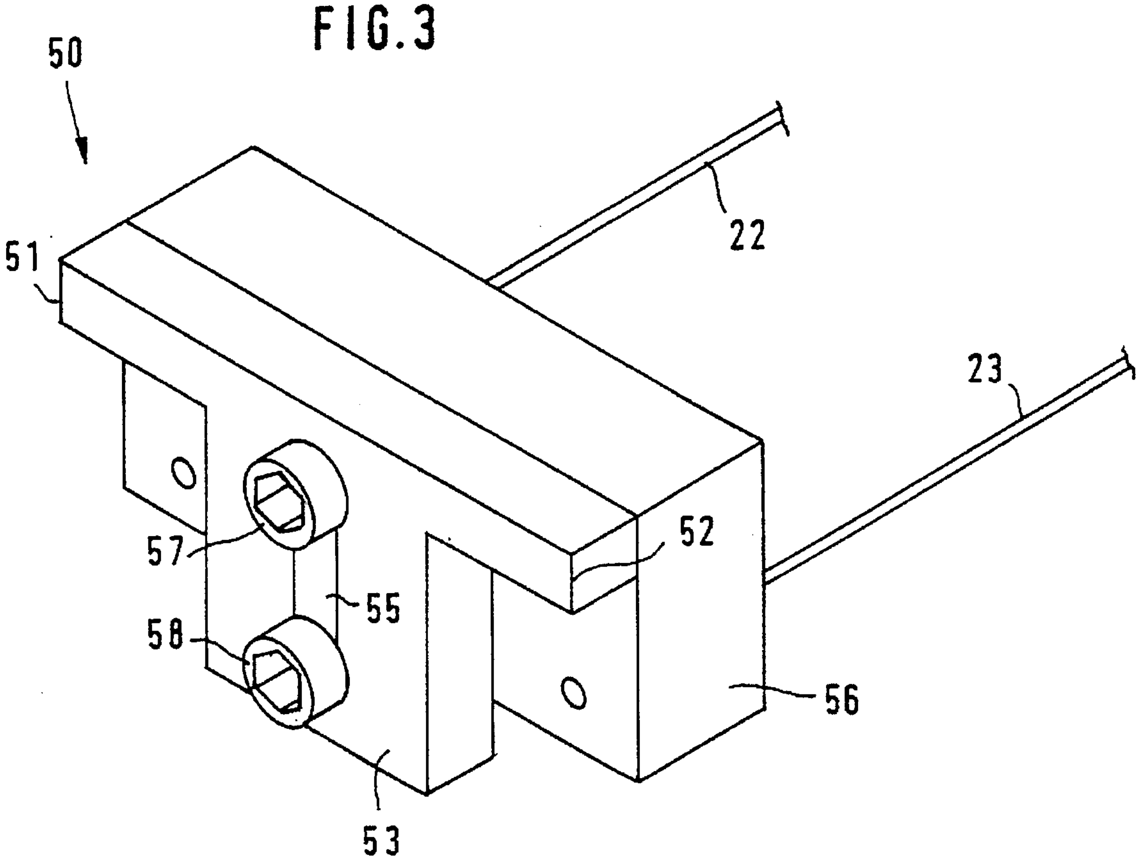
FIG. 3 shows the means to adjust the cathodes.
Figure 4:
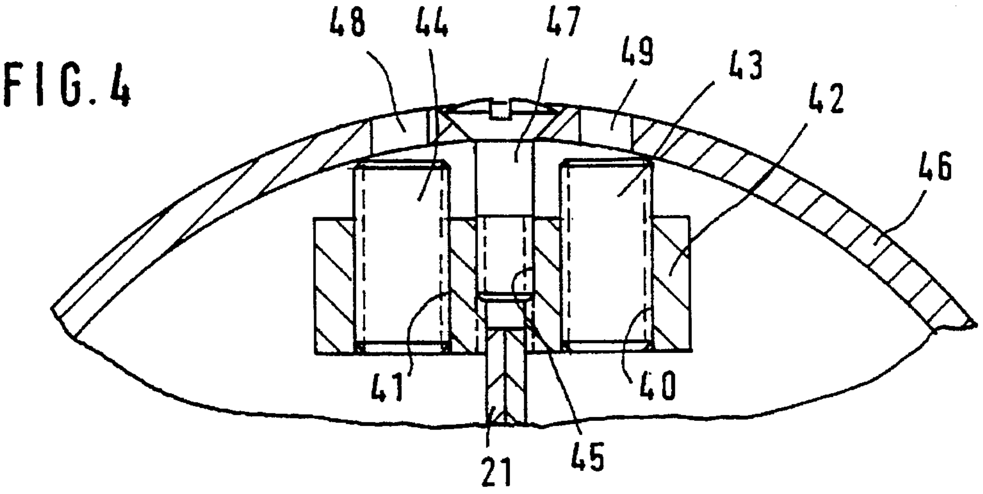
FIG. 4 shows the means to adjust the hollow space lengthwise divider.

The lengthwise dividers 21 with the crossbar 27 can be adjusted vertically by the means 31 in the direction of the arrows 32, 33 and/or can be pivoted around the longitudinal axis in the direction of the arrows 34, 35. As FIG. 4 shows, on at least two places of the lengthwise divider 21, there are holding elements 42 on the side opposite from the crossbar 27. In each holding element 42, to the left and the right of the lengthwise divider 21, there are threaded bores 40, 41 containing threaded screws 43, 44. In the middle of the holding elements 42, there is another threaded bore 45. A countersunk screw 47 passing through the wall 46 of the hollow body 20 attaches the lengthwise divider 21 to the hollow body 20. Above the threaded screws 43, 44, the wall 46 of the hollow body 20 has openings 48, 49. The threaded screws 43, 44 lie against the inner contour of the wall 46 with their screw-in side. They constitute stops for the vertical height of the lengthwise divider 21. By screwing in the threaded screws 43, 44 to different depths, the position of the lengthwise divider 21 is adjusted in the vertical direction 32, 33. The adjustment is made through the openings 48, 49 after loosening the countersunk screw 47. Within the scope of the thread tolerances of the countersunkscrew 47, the lengthwise divider 21 can be tipped in the direction of 34, 35. Likewise the cathodes 22, 23 can be mechanically adjusted in the vertical and horizontal directions by the means 50. FIG. 3 schematically shows the means 50. They consist of a T-shaped holder that is connected by its arms 51, 52 to the hollow body 20. In the middle of the web 53, there is an elongated hole 55 in the vertical plane 54 (FIG. 1). In front of the holder, there is a plate 56 which extends beyond the web 53 and which is attached to the holder by means of screws 57, 58 that pass through the elongated hole. The cathodes 22, 23 are arranged in the plate 56 to the side of the web 53. By screwing the plate 56 to various places in the elongated hole 55, the cathodes can be shifted in the vertical plane 54, as a result of which the position of the cathode 22, 23 changes with respect to the forming electrode. A tipping of the cathodes 22, 23 and an adjustment in the horizontal plane is possible within the leeway of the screws 57, 58 in the elongated hole 55.

Of course, other embodiments of the means 31 and 50 are possible for adjusting the lengthwise divider 21 and the cathodes 22, 23.

By adjusting the cathodes 22, 23 and the lengthwise divider 21, an initial adjustment and a readjustment of the electron beam generating system is achieved. An adjustment of the lengthwise divider 21 with the crossbar 27 brings about a tipping of the normal of the eguipotential fields 37 of the two hollow space sections 24, 25. In this manner, the two radiation fields B can be tipped towards and away from the vertical axis 36.

The uncentered, parallel arrangement of the cathodes 22, 23 and the design described above of the forming electrode bring about a potential distribution which causes a forming of the electrons emitted by the cathodes into the two radiation fields 29 and 30. By dividing up the radiation into two radiation fields 29 and 30, the divergence of each radiation field is cut in half in comparison to applications with Just one cathode. The radiation fields 29, 30 strike the electron beam window 16 and are transmitted through it at a high degree of efficiency, because the electrons strike the film almost vertically and the scatter at the conventional perforated or slit support grid is diminished. Below the electron beam window 16, the electrons strike the workpiece to be processed, which is conveyed past by other devices which are not described here.

With the same emission conditions of the cathodes, a doubling of the electron beam power in the electron beam generating system is achieved by the arrangement of two cathodes 22, 23 and their relative electrical uncoupling. Electron beam generators with more than two cathodes, each of which are arranged in a hollow space segment, are advantageously possible.

The lengthwise divider 21 with the crossbar 27 and the uncentered positions of the cathodes 22, 23 bring about a greatly reduced symmetry of the electron beam generating system. In area 38, this leads to a thorough mixing of the electron trajectories, as a result of which no sharp crossover is formed. That causes a homogenization of the radiation fields 29 and 30 with the same electron beam power. Therefore, a uniform intensity distribution of the radiation fields in the area of the electron beam window 16 prevents damage to the film 17 due to excess radiation.

If the cathodes 22, 23 are switched in parallel, then if one cathode breaks, for example, as a result of wear and tear, the advantage exists that the load Jump and the associated voltage overload in the high-voltage system is reduced in comparison to the use of just one cathode, as a result of which damage to the electron beam window 16 is avoided. As a result, the control and switching complexity for protecting the system can be considerably reduced.

What is claimed is:

1. In a device to irradiate surfaces with electrons, said device having a vacuum chamber that has an electron beam window; an electron beam-permeable film that closes off the vacuum chamber from the ambient medium; and an electron beam generating system, consisting of a cathode and a forming electrode which are connected to a high-voltage and beam current feed line; the improvement that said forming electrode is designed as a tubular hollow body with an inner hollow space lengthwise divider and having a lengthwise slit that is open towards the electron beam window, and a wire-shaped cathode arranged in each hollow space segment.

2. Device according to claim 1, characterized in that said lengthwise divider is connected with a crossbar that faces the open area of said lengthwise slit.

3. A device according to claim 2, including means for vertically adjusting said lengthwise divider and/or pivoting it around the longitudinal axis.

4. A device according to claim 3, including means for adjusting said cathodes in the horizontal or vertical plane.

5. A device according to claim 2, including means for adjusting said cathodes in the horizontal or vertical plane.

6. A device according to claim 1, including means for adjusting said cathodes in the horizontal or vertical plane.

7. A device according to claim 1, including means for vertically adjusting said lengthwise divider and/or pivoting it around the longitudinal axis.

* * * * *